United States Patent
Kim

(10) Patent No.: US 8,659,960 B2
(45) Date of Patent: Feb. 25, 2014

(54) SEMICONDUCTOR MEMORY DEVICE HAVING A DATA LINE SENSE AMPLIFIER

(75) Inventor: Jong-Su Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 60 days.

(21) Appl. No.: 13/309,090

(22) Filed: Dec. 1, 2011

(65) Prior Publication Data

US 2012/0275250 A1 Nov. 1, 2012

(30) Foreign Application Priority Data

Apr. 27, 2011 (KR) .......................... 10-2011-0039669

(51) Int. Cl.
*G11C 7/00* (2006.01)
*G11C 7/06* (2006.01)

(52) U.S. Cl.
CPC ........................................ *G11C 7/06* (2013.01)
USPC ........... 365/196; 365/203; 365/207; 365/226; 365/189.09; 365/205

(58) Field of Classification Search
CPC .. G11C 7/08; G11C 11/4074; G11C 11/4091; G11C 7/065; G11C 2207/065
USPC ...................... 365/196, 207, 205, 189.09, 226
See application file for complete search history.

(56) References Cited

U.S. PATENT DOCUMENTS

2008/0080273 A1* 4/2008 Kang ............................ 365/194
2011/0141830 A1* 6/2011 Chi et al. .................. 365/189.11

FOREIGN PATENT DOCUMENTS

KR 1020110035748 4/2011

OTHER PUBLICATIONS

Office Action issued by the Korean Intellectual Property Office on Sep. 28, 2012.

* cited by examiner

*Primary Examiner* — Thong Q Le
(74) *Attorney, Agent, or Firm* — IP & T Group LLP

(57) ABSTRACT

A memory device includes a data line sense amplifier configured to receive a sense amplifying power source voltage and a sense amplifying ground voltage through a sense amplifying power source line and a sense amplifying ground line, respectively, and sense-amplify data loaded on a pair of data lines, and a pre-charging unit configured to pre-charge and equalize the sense amplifying power source line and the sense amplifying ground line with a sense amplifying pre-charge voltage, generate the sense amplifying pre-charge voltage by voltage dividing the sense amplifying power source voltage and the sense amplifying ground voltage through a voltage dividing path including the sense amplifying power source line and the sense amplifying ground line, and apply the sense amplifying power source voltage to the sense amplifying power source line and the sense amplifying ground voltage to the sense amplifying ground line in response to a sense amplifying pre-charge control signal.

19 Claims, 3 Drawing Sheets

SEMICONDUCTOR MEMORY DEVICE HAVING A DATA LINE SENSE AMPLIFIER

CROSS-REFERENCE TO RELATED APPLICATIONS

The present application claims priority of Korean Patent Application No. 10-2011-0039669, filed on Apr. 27, 2011, which is incorporated herein by reference in its entirety.

BACKGROUND

1. Field

Exemplary embodiments of the present invention relate to a semiconductor memory device, and more particularly, to a data line sense amplifier circuit of a semiconductor memory device.

2. Description of the Related Art

As semiconductor devices become more integrated, methods are developed to increase the number of semiconductor devices included in one wafer.

The increased number of semiconductor devices included in one wafer means that the linewidth of signal transfer lines used inside of a semiconductor device becomes fine. The fine linewidth may cause an increased parasitic resistance of a signal transfer line and an increased size of a capacitor inside of a semiconductor device.

For example, a semiconductor memory device such as a Dynamic Random Access Memory (DRAM) device may have decreased performance when sense-amplifying the data of a pair of bit lines due to the fine linewidth of a signal transfer line as a bit line sense amplifier senses the data of the pair of bit lines in a cell array region when a voltage level needs to be amplified.

Designing the semiconductor device with a minimum number of signal transfer lines increases the overall operation performance of the semiconductor device, regardless of whether the lines are signal transfer lines for transferring a signal, e.g., data or a command, or voltage transfer lines for transferring a voltage, such as a power source voltage or an internal voltage.

SUMMARY

An embodiment of the present invention is directed to a data sense amplifier circuit of a semiconductor memory device that minimizes the number of used signal transfer lines.

In accordance with an embodiment of the present invention, a semiconductor memory device includes: a data line sense amplifier configured to receive a sense amplifying power source voltage and a sense amplifying ground voltage through a sense amplifying power source line and a sense amplifying ground line, respectively, and sense-amplify data loaded on a pair of data lines; and a pre-charging unit configured to pre-charge and equalize the sense amplifying power source line and the sense amplifying ground line with a sense amplifying pre-charge voltage, generate the sense amplifying pre-charge voltage by voltage dividing the sense amplifying power source voltage and the sense amplifying ground voltage through a voltage dividing path including the sense amplifying power source line and the sense amplifying ground line, and apply the sense amplifying power source voltage to the sense amplifying power source line and the sense amplifying ground voltage to the sense amplifying ground line in response to a sense amplifying pre-charge control signal.

In accordance with another embodiment of the present invention, a semiconductor memory device includes: a data line sense amplifier configured to receive a sense amplifying power source voltage and a sense amplifying ground voltage through a sense amplifying power source line and a sense amplifying ground line, respectively, and sense-amplify data loaded on a pair of data lines; a first connection unit configured to control a connection between a sense amplifying power source voltage and the sense amplifying power source line in response to the sense amplifying pre-charge control signal; a second connection unit configured to control a connection between a sense amplifying ground voltage and the sense amplifying ground line in response to the sense amplifying pre-charge control signal; and a third connection unit configured to control a connection between the sense amplifying power source line and the sense amplifying ground line in response to the sense amplifying pre-charge control signal.

A method of a bit line sense amplifier circuit of a semiconductor memory device that sense-amplifies or equalizes a pair of bit lines BL and BLB with a voltage applied from a sense amplifying power source line and a sense amplifying ground line, includes: toggling a sense amplifying pre-charge control signal in response to an active command; enabling a plurality of sense amplifying enable signals after the toggling of the sense amplifying pre-charge control signal; generating a sense amplifying pre-charge voltage by dividing a sense amplifying power source voltage in response to the toggling of the sense amplifying pre-charge control signal; supplying the generated sense amplifying pre-charge voltage to the sense amplifying power source line and the sense amplifying ground line to equalize a pair of bit lines; sense-amplifying the pair of bit lines by supplying a sense amplifying power source voltage to the sense amplifying power source line and supplying a sense amplifying ground voltage to a sense amplifying ground line during a period where the plurality of sense amplifying enable signals are enabled.

DETAILED DESCRIPTION

Figure 1:
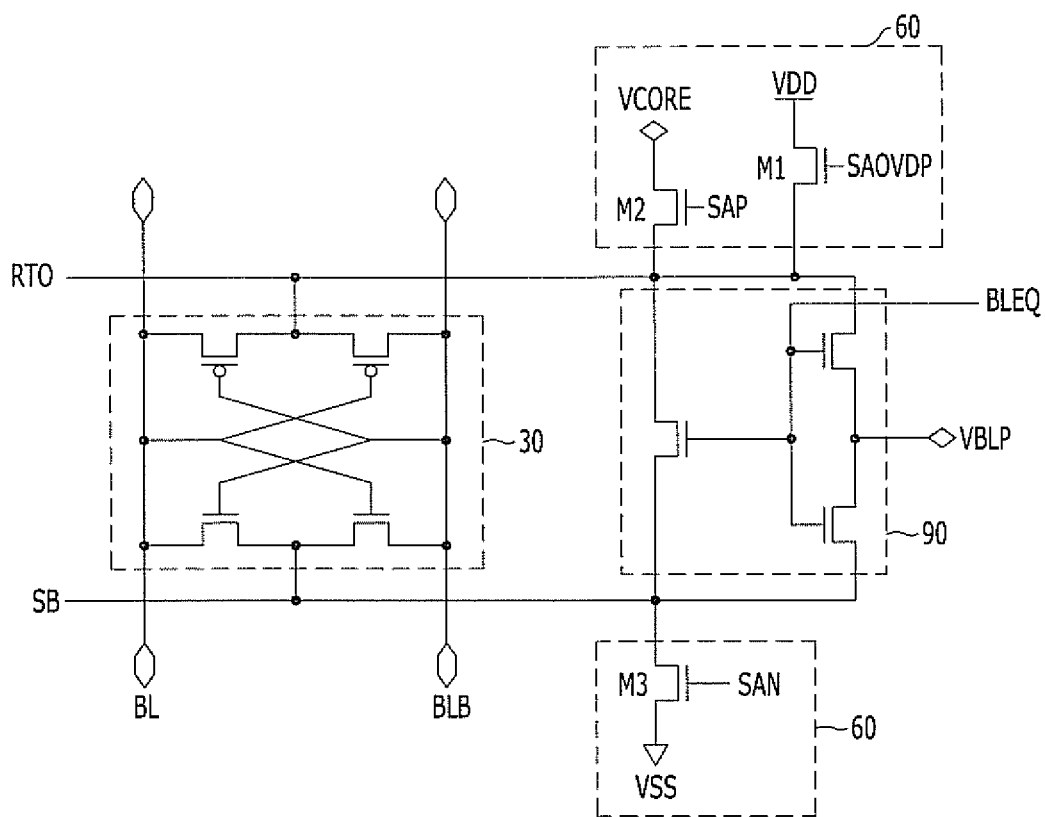
FIG. 1 is a circuit diagram illustrating a conventional bit line sense amplifier array of a semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a circuit diagram illustrating a conventional bit line sense amplifier array of a semiconductor memory device.

Referring to FIG. 1, the bit line sense amplifier array of the semiconductor memory device includes a bit line sense amplifier 30, a bit line sense amplifier power source line driver 60, and a bit line sense amplifier power source line equalizer/pre-charger 90.

When an enable signal is enabled and a pull-down power source line SB and a pull-up power source line RTO are driven with a designated voltage level, the bit line sense amplifier 30 senses a voltage difference between a pair of bit lines BL and BLB. The pair of bit lines BL and BLB are in a charge sharing state and have a slight voltage difference, and the bit line sense amplifier 30 amplifies one bit line to a ground voltage VSS and the other bit line to a core voltage VCORE.

The bit line sense amplifier power source line driver 60 includes a first NMOS transistor M1, a second NMOS transistor M2, and a third NMOS transistor M3. The second NMOS transistor M2 drives the pull-up power source line RTO with the core voltage VCORE in response to a pull-up power source line drive control signal SAP.

The third NMOS transistor M3 drives the pull-down power source line SB with the ground voltage VSS in response to a pull-down power source line drive control signal SAN. The first NMOS transistor M1, which is an over-driver, drives the pull-up power source line RTO with a power source voltage VDD in response to an over-driving pulse SAOVDP, which is an over-driver control signal.

Also, the bit line sense amplifier power source line equalizer/pre-charger 90 pre-charges the pull-up power source line RTO and the pull-down power source line SB of the bit line sense amplifier 30 with a bit line pre-charge voltage VBLP in response to a bit line equalizing signal BLEQ.

More specifically, the bit line sense amplifier array of the semiconductor memory device includes a total of four signal lines SAOVDP, SAP, SAN, and BLEQ and a total of four power source lines VCORE, VBLP, VDD, and VSS.

Figure 2:
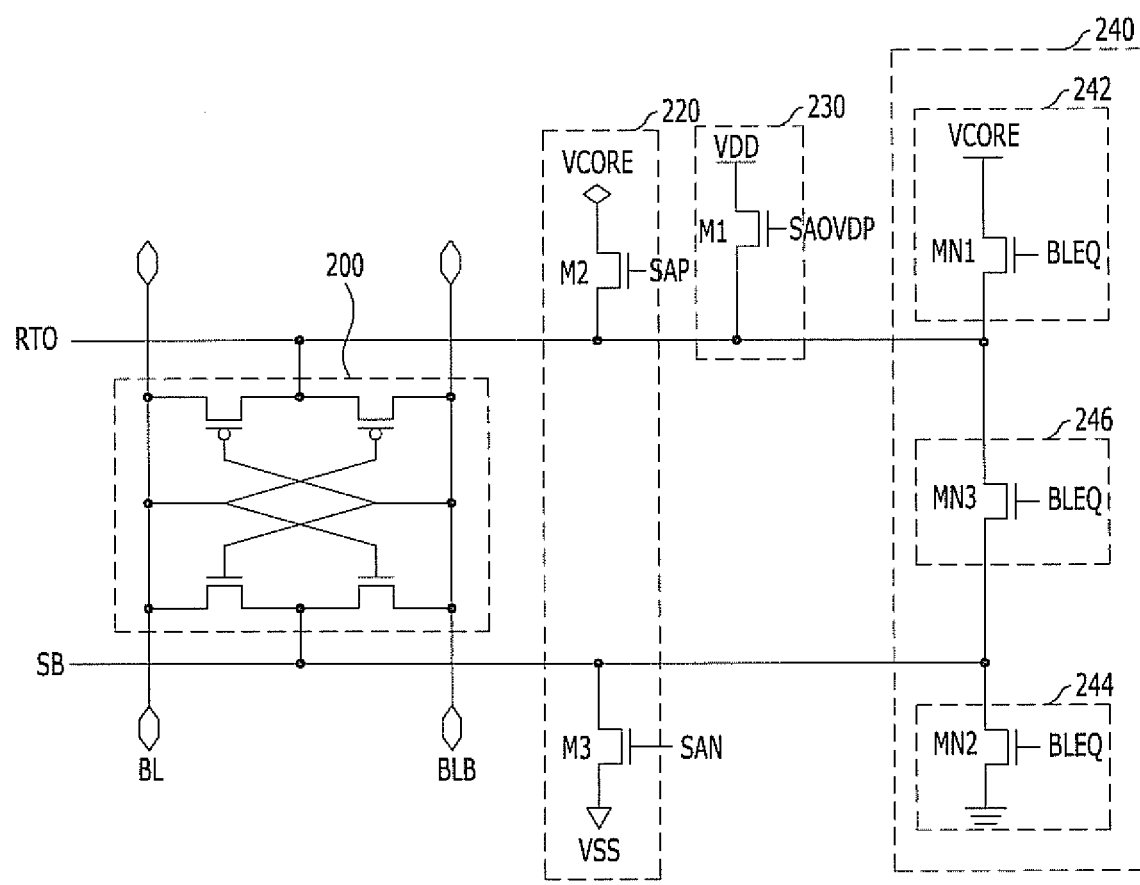
FIG. 2 is a circuit diagram illustrating a bit line sense amplifier array of a semiconductor memory device in accordance with an embodiment of the present invention.

FIG. 2 is a circuit diagram illustrating a bit line sense amplifier array of a semiconductor memory device in accordance with an embodiment of the present invention.

Referring to FIG. 2, the bit line sense amplifier array of the semiconductor memory device in accordance with the embodiment of the present invention includes a bit line sense amplifier 200, 220 and 230, and a pre-charging unit 240. The bit line sense amplifier 200, 220 and 230 receives a sense amplifying power source voltage VCORE and a sense amplifying ground voltage VSS through a sense amplifying power source line RTO and a sense amplifying ground line SB, and the bit line sense amplifier 200, 220, and 230 sense-amplifies data loaded on a pair of bit lines BL and BLB; or the bit line sense amplifier 200, 220 and 230 receives a sense amplifying pre-charge voltage VBLP and equalizes a pair of bit lines BL and BLB. The pre-charging unit 240 generates the sense amplifying pre-charge voltage VBLP by dividing the level of the sense amplifying power source voltage VCORE at a designated rate in response to a sense amplifying pre-charge control signal BLEQ.

The bit line sense amplifier 200, 220 and 230 includes a power source connection unit 220 and a sense amplifying operation unit 200. The power source connection unit 220 controls the connection between the sense amplifying power source voltage VCORE and a sense amplifying power source line RTO in response to a sense amplifying enable signal SAP, and the power source connection unit 220 controls the connection between a sense amplifying ground voltage VSS and a sense amplifying ground line SB in response to a sense amplifying enable signal SAN. The sense amplifying operation unit 200 sense-amplifies a pair of bit lines BL and BLB during an enabling period of the sense amplifying enable signal SAP or SAN where the sense amplifying power source voltage VCORE and the sense amplifying ground voltage VSS are applied to the sense amplifying power source line RTO and the sense amplifying ground line SB, and equalizes the pair of bit lines BL and BLB during the enabling period of the sense amplifying pre-charge control signal BLEQ where the sense amplifying pre-charge voltage VBLP is applied to the sense amplifying power source line RTO and the sense amplifying ground line SB. Also, the bit line sense amplifier 200, 220 and 230 further includes an over-driving control unit 230 that controls the connection between an external power source voltage VDD and the sense amplifying power source line RTO in response to an over-driving enable signal SAOVDP.

The pre-charging unit 240 includes a first connection unit 242, a second connection unit 244, and a third connection unit 246. The first connection unit 242 controls the connection/disconnection between the sense amplifying power source voltage VCORE and the sense amplifying power source line RTO in response to the sense amplifying pre-charge control signal BLEQ. The second connection unit 244 controls the connection/disconnection between the sense amplifying ground voltage VSS and the sense amplifying ground line SB in response to the sense amplifying pre-charge control signal BLEQ. The third connection unit 246 controls the connection/disconnection between the sense amplifying power source line RTO and the sense amplifying ground line SB in response to the sense amplifying pre-charge control signal BLEQ.

The first connection unit 242 includes a first NMOS transistor MN1. A source and a drain of the first NMOS transistor MN1 are coupled between the sense amplifying power source voltage VCORE and the sense amplifying power source line RTO, and the sense amplifying pre-charge control signal BLEQ applied to a gate. The first NMOS transistor MN1 has a first resistance value during a turn-on operation and has a switched off state during a turn-off operation.

Also, the second connection unit 244 includes a second NMOS transistor MN2. A source and a drain of the second NMOS transistor MN2 are coupled between the sense amplifying ground line SB and the sense amplifying ground voltage VSS end, and the sense amplifying pre-charge control signal BLEQ applied to a gate. The second NMOS transistor MN2 has a second resistance value during a turn-on operation and has a switched off state during a turn-off operation.

The third connection unit 246 includes a third NMOS transistor MN3. A source and a drain of the third NMOS transistor MN3 are coupled between the sense amplifying power source line RTO and the sense amplifying ground line SB, and the sense amplifying pre-charge control signal BLEQ applied to a gate. The third NMOS transistor MN3 has a third resistance value during a turn-on operation and has a switched off state during a turn-off operation.

The first resistance value, the second resistance value, and the third resistance value may have the following diverse correlations.

First, a sum of the second resistance value and the third resistance value is the same as the first resistance value; and the second resistance value is more than 10 times greater than the third resistance value. In other words, the level of the voltage applied to the sense amplifying power source line RTO becomes exactly a half of the voltage level of the sense amplifying power source voltage VCORE in response to the enabling of the sense amplifying pre-charge control signal BLEQ. In short, the sense amplifying pre-charge voltage VBLP is applied to the sense amplifying power source line RTO. Since the third resistance value is small, a voltage of almost the same level as the sense amplifying pre-charge voltage VBLP applied to the sense amplifying power source line RTO is applied to the sense amplifying ground line SB as well, and this small drop in voltage level does not affect the operation that equalizes the pair of bit lines BL and BLB.

Secondly, a sum of the first resistance value and the third resistance value is the same as the second resistance value; and the first resistance value is more than 10 times greater than the third resistance value. In other words, the level of the sense amplifying ground line SB becomes exactly a half of the level of the sense amplifying power source voltage VCORE in response to the enabling of the sense amplifying pre-charge control signal BLEQ. In short, the sense amplifying pre-charge voltage VBLP is applied to the sense amplifying ground line SB. Since the third resistance value is small, a voltage of almost the same level as the voltage applied to the sense amplifying ground line SB is applied to the sense amplifying power source line RTO as well, and this small drop in voltage level does not affect the operation that equalizes the pair of bit lines BL and BLB.

Thirdly, the first resistance value and the second resistance value are the same; and the first resistance value and the second resistance value are more than 10 times greater than the third resistance value, individually. In other words, the level of the voltage applied to the sense amplifying power source line RTO becomes a little greater than a half of the sense amplifying power source voltage VCORE, and the level of the voltage applied to the sense amplifying ground line SB is a little smaller than a half of the sense amplifying power source voltage VCORE in response to the enabling of the sense amplifying pre-charge control signal BLEQ. In short, a voltage a little higher than the sense amplifying pre-charge voltage VBLP is applied to the sense amplifying power source line RTO, a voltage little lower than the sense amplifying pre-charge voltage VBLP is applied to the sense amplifying ground line SB. Since the third resistance value is small, there is little voltage difference between the voltage applied to the sense amplifying power source line RTO and the voltage applied to the sense amplifying ground line SB, and this small drop in voltage level does not affect the operation that equalizes the pair of bit lines BL and BLB.

As shown above, the sense amplifying pre-charge voltage VBLP is not applied from a circuit outside of sense amplifier array, but the sense amplifying pre-charge voltage VBLP is generated by dividing the sense amplifying power source voltage VCORE in the bit line sense amplifier array of the semiconductor memory device in accordance with an embodiment of the present invention.

To sum up, the difference between the bit line sense amplifier array of the semiconductor memory device illustrated in FIG. 1 and the bit line sense amplifier array of the semiconductor memory device illustrated in FIG. 2 is that the sense amplifying pre-charge voltage VBLP is not received from a circuit outside of the bit line sense amplifier array of the semiconductor memory device but is generated in the bit line sense amplifier array of the semiconductor memory device.

As a result, the bit line sense amplifier array of the semiconductor memory device in accordance with an embodiment of the present invention includes a total of four signal lines SAOVDP, SAP, SAN and BLEQ and a total of three power source lines VCORE, VDD and VSS. As described above, the bit line sense amplifier array of the semiconductor memory device implements one less power source line while using the same area as the conventional bit line sense amplifier array. Because the bit line sense amplifier array of the semiconductor memory device uses one less power source line, the lines of the bit line sense amplifier array may have wider linewidth than the lines of the conventional bit line sense amplifier array. Therefore, the performance of sense-amplifying the data of a pair of bit lines BL and BLB may be improved.

Also, since the bit line sense amplifier array of the present invention generates the sense amplifying pre-charge voltage VBLP, the semiconductor memory device does not implement an independent structure for generating the sense amplifying pre-charge voltage VBLP. In short, while a conventional semiconductor memory device implements a structure that generates the sense amplifying pre-charge voltage VBLP within the conventional semiconductor memory device, the semiconductor memory device according to an embodiment of the present invention does not need such a structure. Therefore, the semiconductor memory device according to an embodiment of the present invention has advanced from the conventional semiconductor memory device in terms of overall operation performance.

FIG. 2 illustrates that the pair of bit lines BL and BLB are regarded as a pair of bit lines, but the pair of bit lines BL and BLB may be designed to be the same as a pair of local lines. In other words, the technology of the present invention may be applied not only to the bit line sense amplifier circuit as illustrated in FIG. 2 but to a local line sense amplifier circuit as well.

Figure 3:
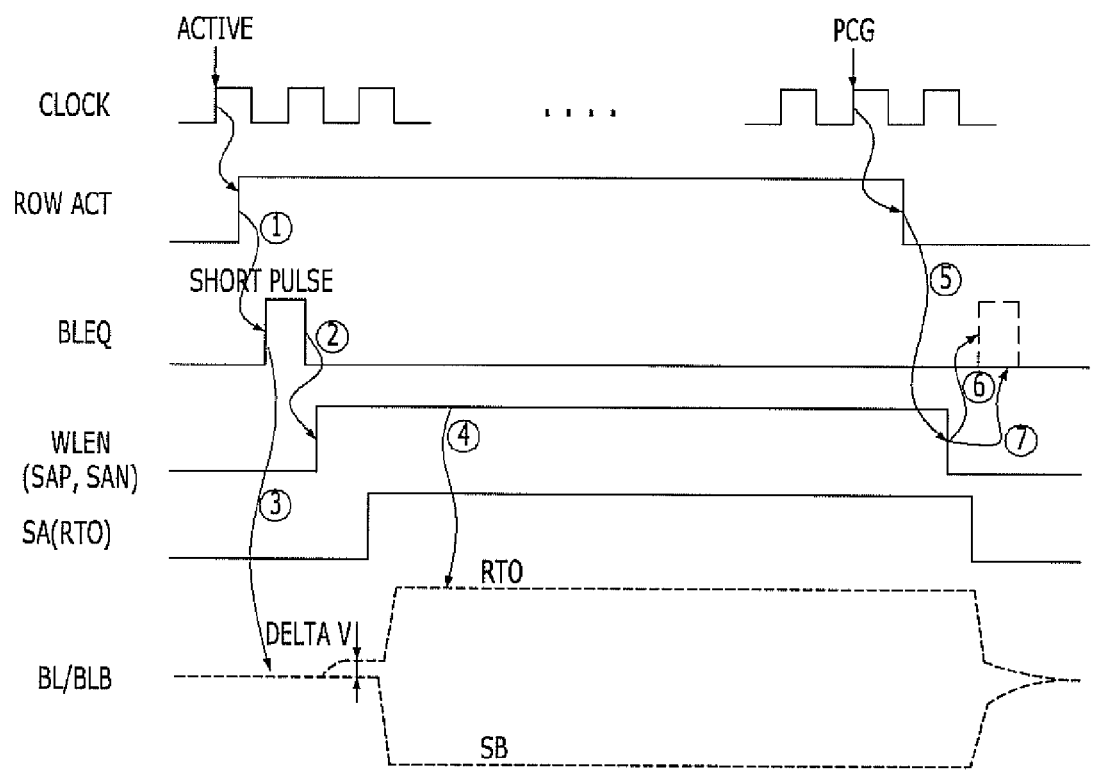
FIG. 3 is a timing diagram illustrating an operation of a bit line sense amplifier array of the semiconductor memory device shown in FIG. 2.

FIG. 3 is a timing diagram illustrating an operation of the bit line sense amplifier array of the semiconductor memory device shown in FIG. 2 in accordance with an embodiment of the present invention.

Referring to FIG. 3, the operation of a bit line sense amplifier circuit of a semiconductor memory device that sense-amplifies or equalizes a pair of bit lines BL and BLB with a voltage applied from the sense amplifying power source line RTO and the sense amplifying ground line SB includes: toggling a sense amplifying pre-charge control signal BLEQ in response to an active command ACTIVE ①; enabling sense amplifying enable signals SAP and SAN after the toggling of the sense amplifying pre-charge control signal BLEQ ②; generating a sense amplifying pre-charge voltage VBLP by dividing the sense amplifying power source voltage VCORE at a designated rate in response to the toggling of the sense amplifying pre-charge control signal BLEQ; supplying the generated sense amplifying pre-charge voltage VBLP to the sense amplifying power source line RTO and the sense amplifying ground line SB to equalize a pair of bit lines BL and BLB ③; and sense-amplifying the pair of bit lines BL and BLB by supplying a sense amplifying power source voltage VDD to the sense amplifying power source line RTO and supplying a sense amplifying ground voltage VSS to a sense amplifying ground line SB during a period where the sense amplifying enable signals SAP and SAN are enabled ④.

When a pre-charge command PCG is applied, there may be two methods. First, the operation of the bit line sense amplifier circuit of a semiconductor memory device may further include the following two steps of: disabling the sense amplifying enable signals SAP and SAN in response to the pre-charge command PCG ⑤; and toggling the sense amplifying pre-charge control signal BLEQ after the sense amplifying enable signals SAP and SAN are disabled ⑥.

Secondly, the operation of the bit line sense amplifier circuit of a semiconductor memory device may further include: disabling the sense amplifying enable signals SAP and SAN in response to the pre-charge command PCG ⑤ without toggling the sense amplifying pre-charge control signal BLEQ before the active command ACTIVE is applied after the sense amplifying enable signals SAP and SAN are disabled ⑦.

The sense amplifying enable signals SAP and SAN are enabled after a designated time passes from the point in time when the active command ACTIVE is applied and disabled in response to the pre-charge command PCG.

The sense amplifying pre-charge control signal BLEQ may be toggled in two types.

First, the sense amplifying pre-charge control signal BLEQ is toggled after a designated time passes from a point in time when the active command ACTIVE is applied before the sense amplifying enable signals SAP and SAN are enabled, and is not toggled regardless of the application of the pre-charge command PCG.

Secondly, the sense amplifying pre-charge control signal BLEQ is toggled after a designated time passes from a point in time when the active command ACTIVE is applied before the sense amplifying enable signals SAP and SAN are enabled, and is toggled in response to the application of the pre-charge command PCG.

The enabling period of the sense amplifying enable signals SAP and SAN and the enabling period of the pre-charge command PCG do not overlap.

As illustrated in FIG. 3, the toggling of the sense amplifying pre-charge control signal BLEQ forms a short pulse. The sense amplifying pre-charge control signal BLEQ forms a short pulse because when the duration where the sense amplifying pre-charge control signal BLEQ is enabled to a logic high level becomes too long, a current path may be formed between the sense amplifying power source voltage VCORE and the sense amplifying ground voltage VSS end, causing unnecessary current consumption.

FIG. 3 does not show an over-driving operation. If the over-driving operation is to be shown in FIG. 3, the enabling period of an over-driving enable signal SAOVDP may be overlapped with the enabling period of the sense amplifying enable signals SAP and SAN.

The structure according to the embodiment of the present invention described above is limited to the operation of a bit line sense amplifier. However, the core structure of the embodiment of the present invention may be applied to the operation of a local line sense amplifier as well, and the structure of the embodiment of the present invention may also be applied to all structures where a pre-charge operation between two arbitrary lines needs to be performed.

More specifically, a structure requiring the pre-charge operation performed between two arbitrary lines is described hereafter by referring to FIG. 2. The structure includes a first line, which corresponds to the sense amplifying power source line RTO; a second line, which corresponds to the sense amplifying ground line SB; an active operation controller, which corresponds to a reference numeral '220', that provides the first line with an active voltage, which corresponds to a core voltage VCORE, and provides the second line with a ground voltage in an active duration; and a pre-charging unit, which corresponds to a reference numeral '240', that divides the active voltage at a designated rate and supplies the divided voltage to the first and second lines in a pre-charge duration.

The active operation controller, which corresponds to a reference numeral '220', includes a power source connection unit that controls the connection between the first line and an active voltage and a ground connection unit that controls the connection between the second line and a ground voltage in response to an active duration entering signal, which corresponds to the sense amplifying enable signals SAP and SAN. The power source connection unit corresponds to a reference numeral 'M2', and the ground connection unit corresponds to a reference numeral 'M3.'

Also, the pre-charging unit, which corresponds to a reference numeral '240,' includes a first connection unit, a second connection unit, and a third connection unit. The first connection unit corresponds to a reference numeral '242' and controls the connection between the first line and the active voltage in response to a pre-charge duration entering control signal, which corresponds to the sense amplifying pre-charge control signal BLEQ. The second connection unit corresponds to a reference numeral '244' and controls the connection between the second line and the ground voltage in response to the pre-charge duration entering control signal. The third connection unit corresponds to a reference numeral '246' and controls the connection between the first line and the second line in response to the pre-charge duration entering control signal.

As described above, the structure according to an embodiment of the present invention may be applied to a structure that performs the operation of a sense amplifier and to a structure that performs a pre-charge operation between two lines.

According to an embodiment of the present invention, the number of power source lines used in the inside of a semiconductor memory device is decreased as the bit line sense amplifier array of the semiconductor memory device generates a voltage for sense-amplifying a bit line through voltage distribution, instead of receiving a voltage for pre-charging a bit line from the a circuit outside of the sense amplifier array.

For this reason, the linewidth of each line used in the semiconductor memory device may be increased without increasing the area occupied by the bit line sense amplifier array in the semiconductor memory device, and the performance of an operation of sense-amplifying a bit line in the semiconductor memory device may be improved.

Also, since the voltage for pre-charging a bit line is generated directly in the bit line sense amplifier array, a constituent element for generating the voltage for pre-charging the bit line in the semiconductor memory device is not included. Therefore, the semiconductor memory device in accordance with an embodiment of the present invention has an advanced operation performance from the conventional semiconductor memory devices.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
  a data line sense amplifier configured to receive a sense amplifying power source voltage and a sense amplifying ground voltage through a sense amplifying power source line and a sense amplifying ground line, respectively, and sense-amplify data loaded on a pair of data lines; and
  a pre-charging unit configured to pre-charge and equalize the sense amplifying power source line and the sense amplifying ground line with a sense amplifying pre-charge voltage, generate the sense amplifying pre-charge voltage by dividing the sense amplifying power source voltage through a voltage dividing path including the sense amplifying power source line and the sense amplifying ground line, and apply the sense amplifying pre-charge voltage to the sense amplifying power source line and the sense amplifying ground line in response to a sense amplifying pre-charge control signal.

2. The semiconductor memory device of claim 1, wherein the data line sense amplifier comprises:
  a power source connection unit configured to control a connection between a sense amplifying power source voltage and the sense amplifying power source line and control a connection between a sense amplifying ground voltage and the sense amplifying ground line in response to a sense amplifying enable signal; and a sense amplifying operation unit configured to sense-amplify the pair of data lines in an activation period of the sense amplifying enable signal where the sense amplifying power source voltage and the sense amplifying ground voltage are applied to the sense amplifying power source line and the sense amplifying ground line, respectively, and equalize the pair of data lines in an activation period of the sense amplifying pre-charge control signal when the sense amplifying pre-charge voltage is applied to the sense amplifying power source line and the sense amplifying ground line.

3. The semiconductor memory device of claim 2, wherein the data line sense amplifier further comprises:

an over-driving control unit configured to control a connection between a power source voltage and the sense amplifying power source line in response to an over-driving enable signal.

4. The semiconductor memory device of claim 3, wherein the sense amplifying enable signal is activated after a period of time passes from a point in time when an active command is applied, and the sense amplifying enable signal is deactivated in response to a pre-charge command.

5. The semiconductor memory device of claim 4, wherein the sense amplifying pre-charge control signal toggles before the period of time passes after the active command is applied.

6. The semiconductor memory device of claim 4, wherein the sense amplifying pre-charge control signal toggles before the period of time passes after the active command is applied, and toggles in response to the pre-charge command.

7. The semiconductor memory device of claim 5, wherein an activation period of the sense amplifying enable signal and an activation period of the sense amplifying pre-charge control signal do not overlap.

8. The semiconductor memory device of claim 6, wherein an activation period of the sense amplifying enable signal and an activation period of the sense amplifying pre-charge control signal do not overlap.

9. The semiconductor memory device of claim 1, wherein the pre-charging unit comprises:

a first connection unit configured to control a connection between the sense amplifying power source voltage and the sense amplifying power source line in response to a sense amplifying pre-charge control signal;

a second connection unit configured to control a connection between the sense amplifying ground voltage and the sense amplifying ground line in response to the sense amplifying pre-charge control signal; and a third connection unit configured to control a connection between the sense amplifying power source line and the sense amplifying ground line in response to the sense amplifying pre-charge control signal.

10. The semiconductor memory device of claim 9, wherein the first connection unit comprises:

a source and a drain of a first NMOS transistor coupled between the sense amplifying power source voltage and the source-coupled sense amplifying power source line, and the sense amplifying pre-charge control signal applied to a gate, wherein the first NMOS transistor has a first resistance value during a turn-on operation and has a switched off state during a turn-off operation.

11. The semiconductor memory device of claim 10, wherein the second connection unit comprises:

a source and a drain of a second NMOS transistor coupled between the sense amplifying ground line and the source-coupled sense amplifying ground voltage, and the sense amplifying pre-charge control signal applied to a gate, wherein the second NMOS transistor has a second resistance value during a turn-on operation and has a switched off state during a turn-off operation.

12. The semiconductor memory device of claim 11, wherein the third connection unit comprises:

a source and a drain of a third NMOS transistor coupled between the sense amplifying power source line, and the source-coupled sense amplifying ground line and the sense amplifying pre-charge control signal applied to a gate, wherein the third NMOS transistor has a third resistance value during a turn-on operation and has a switched off state during a turn-off operation.

13. The semiconductor memory device of claim 12, wherein a sum of the second resistance value and the third resistance value is the same as the first resistance value, and the second resistance value is more than 10 times greater than the third resistance value.

14. The semiconductor memory device of claim 12, wherein a sum of the first resistance value and the third resistance value is the same as the second resistance value, and the first resistance value is more than 10 times greater than the third resistance value.

15. The semiconductor memory device of claim 12, wherein the first resistance value and the second resistance value are the same, and the first resistance value and the second resistance value are more than 10 times greater than the third resistance value, individually.

16. A method of a bit line sense amplifier circuit of a semiconductor memory device that sense-amplifies or equalizes a pair of bit lines BL and BLB with a voltage applied from a sense amplifying power source line and a sense amplifying ground line, comprising:

toggling a sense amplifying pre-charge control signal in response to an active command;

enabling a plurality of sense amplifying enable signals after the toggling of the sense amplifying pre-charge control signal;

generating a sense amplifying pre-charge voltage by dividing a sense amplifying power source voltage in response to the toggling of the sense amplifying pre-charge control signal;

supplying the sense amplifying pre-charge voltage to the sense amplifying power source line and the sense amplifying ground line to equalize a pair of bit lines;

sense-amplifying the pair of bit lines by supplying a sense amplifying power source voltage to the sense amplifying power source line and supplying a sense amplifying ground voltage to a sense amplifying ground line during a period where the plurality of sense amplifying enable signals are enabled.

17. The method of claim 16, further comprising:

disabling the plurality of sense amplifying enable signals in response to the pre-charge command;

and toggling the sense amplifying pre-charge control signal after the plurality of sense amplifying enable signals are disabled.

18. The method of claim 16, further comprising:

disabling the plurality of sense amplifying enable signals in response to the pre-charge command without toggling the sense amplifying pre-charge control signal before the active command is applied after the plurality of sense amplifying enable signals are disabled.

19. A semiconductor device, comprising:
a first line;
a second line;
an active operation control unit configured to provide an active voltage to the first line, and a ground voltage to the second line during an active period; and
a pre-charge operation control unit configured to generate a sense amplifying pre-charge voltage as a divided active voltage by dividing the active voltage, and provide the sense amplifying pre-charge voltage to the first line and the second line during a pre-charge period.

* * * * *